(12) United States Patent
Yi et al.

(10) Patent No.: US 9,444,006 B2
(45) Date of Patent: Sep. 13, 2016

(54) OPTICAL DEVICE AND METHOD FOR MANUFACTURING SAME

(75) Inventors: Gyuchul Yi, Seoul (KR); Kunook Chung, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/117,613

(22) PCT Filed: Aug. 14, 2012

(86) PCT No.: PCT/KR2012/006484
§ 371 (c)(1),
(2), (4) Date: Nov. 13, 2013

(87) PCT Pub. No.: WO2013/025043
PCT Pub. Date: Feb. 21, 2013

(65) Prior Publication Data
US 2014/0291690 A1    Oct. 2, 2014

(30) Foreign Application Priority Data
Aug. 16, 2011  (KR) .................... 10-2011-0081270

(51) Int. Cl.
H01L 33/00 (2010.01)
H01L 33/24 (2010.01)
H01L 33/32 (2010.01)
H01L 33/08 (2010.01)

(52) U.S. Cl.
CPC ............. H01L 33/24 (2013.01); H01L 33/007 (2013.01); H01L 33/32 (2013.01); H01L 33/08 (2013.01)

(58) Field of Classification Search
CPC ..... H01L 33/24; H01L 33/32; H01L 33/007; H01L 33/36; H01L 33/40
USPC ............... 257/79, 81, 98, 99; 438/22, 29, 39
See application file for complete search history.

(56) References Cited

U.S. PATENT DOCUMENTS

| | | | |
|---|---|---|---|
| 4,084,114 A * | 4/1978 | Kuroda et al. ................. 313/496 |
| 4,098,939 A * | 7/1978 | Kuroda ..................... G09F 9/33 |
| | | | 313/496 |
| 2012/0141799 A1* | 6/2012 | Kub et al. ..................... 428/408 |

FOREIGN PATENT DOCUMENTS

| | | | |
|---|---|---|---|
| JP | 2007-027448 A | 2/2007 | |
| JP | 2007-329354 A | 12/2007 | |
| JP | 2009-272334 | * 11/2009 | ............ H01L 31/04 |
| KR | 10-2011-0024209 A | 3/2011 | |
| KR | 10-2011-0065202 A | 6/2011 | |

OTHER PUBLICATIONS

Zhu et al., "Optical transmittance of multilayer graphene", 2014, A Letters Journal Exploring the Frontiers of Physics, EPL, 108, pp. 17007; Oct. 2014.*
International Search Report for PCT/KR2012/006484.

* cited by examiner

*Primary Examiner* — Nikolay Yushin
(74) *Attorney, Agent, or Firm* — Revolution IP, PLLC

(57) ABSTRACT

Provided are an optical device and a method for manufacturing same. The optical device according to the present invention including: a transparent amorphous substrate; a current injection layer formed on the substrate; a graphite layer formed on the current injection layer; and a semiconductor unit formed on the graphite layer, wherein the semiconductor unit is formed after forming the graphite layer on the amorphous substrate, thereby overcoming the problems of conventional methods that involve forming a semiconductor unit on an amorphous substrate, and the semiconductor unit of the present invention has superior crystallinity.

22 Claims, 7 Drawing Sheets

OPTICAL DEVICE AND METHOD FOR MANUFACTURING SAME

CROSS REFERENCE TO RELATED APPLICATIONS AND CLAIM OF PRIORITY

This patent application is a National Phase application under 35 U.S.C. §371 of International Application No. PCT/KR2012/006484, filed Aug. 14, 2012, which claims priority to Korean Patent Application No. 10-2011-0081270 filed Aug. 16, 2011, entire contents of which are incorporated herein by reference.

BACKGROUND

1. Field of the Invention

The present invention relates to an optical device and a method for manufacturing the same.

2. Description of the Related Art

Since a light-emitting diode (LED) is highly efficient and has a long lifespan, the LED drastically reduces energy consumption and has attracted much attention as an environmentally friendly optical device.

Recently, advanced display devices and illuminators have been developed using light-emitting diodes (LEDs), and in addition, LEDs in portable phone keypads/flashes and automobile headlights/pilot lights have been manufactured.

In particular, since blue LEDs using a nitride semiconductor material may be applied in various fields, such as LED white illuminators or backlight units (BLUs) of liquid crystal display televisions (LCD TVs), vast amounts of research and investment in blue LEDs are being realized.

However, it is difficult to employ a light-emitting semiconductor as a large-area display device or as a light source for an illuminator. In particular, it is difficult to manufacture an LED on a large area, and the LED has low price competitiveness.

Since the LED uses a single crystalline substrate, fabrication costs are high and limitations with the sizes of products are problematic.

Accordingly, to enable the scaling-up of size and low-cost manufacturing of LEDs, it is highly desirable to develop a short-wavelength optical device using an amorphous substrate capable of a low-cost large-area manufacturing process.

However, it is difficult to manufacture a highly efficient LED using a nitride semiconductor material on an amorphous substrate. This is because when a nitride thin layer is formed on the amorphous substrate, a polycrystalline thin layer is formed.

Accordingly, an LED using a polycrystalline nitride thin layer is inferior in device characteristics and efficiency to an LED using a single crystalline nitride semiconductor material manufactured on a single crystalline sapphire substrate.

The present invention is directed to an optical device, which uses an amorphous substrate and forms a semiconductor unit having a high crystallinity to improve electrical and optical properties, and a method of manufacturing the same.

SUMMARY

One aspect of the present invention provides an optical device including a transparent amorphous substrate, a current injection layer formed on the substrate, a graphite layer formed on the current injection layer, and a semiconductor unit formed on the graphite layer.

The present invention may further provide a method of manufacturing an optical device, including the steps of preparing a transparent amorphous substrate, forming a current injection layer on the substrate, forming a graphite layer on the current injection layer, and forming a semiconductor unit on the graphite layer.

The present invention can provide an optical device and a method of manufacturing the same in which after a graphite layer is formed on a transparent amorphous substrate, a semiconductor unit is formed, and problems caused by the formation of a semiconductor unit on a conventional amorphous substrate can be resolved, yielding a semiconductor unit having a high crystallinity. Also, by controlling the thicknesses of the current injection layer and the graphite layer, the advantages of the transparent amorphous substrate can be maximized so that a direction of light emitted by or absorbed in the optical device can be controlled.

DETAILED DESCRIPTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully describe the scope of the present invention to those of ordinarily skill in the art. Descriptions of irrelevant components are omitted from the drawings so as to clearly describe the exemplary embodiments of the present invention. Like elements are denoted by like reference numerals in the drawings.

Throughout this specification, it will be understood that when an element is referred to as being "connected" to another element, it can be "directly connected" to the other element or "electrically connected" to the other element with other elements therebetween. It will be further understood that when an element is referred to as "comprises" another element, the element is intended not to exclude one or more other elements, but to further include one or more other elements, unless the context clearly indicates otherwise.

Figure 1:
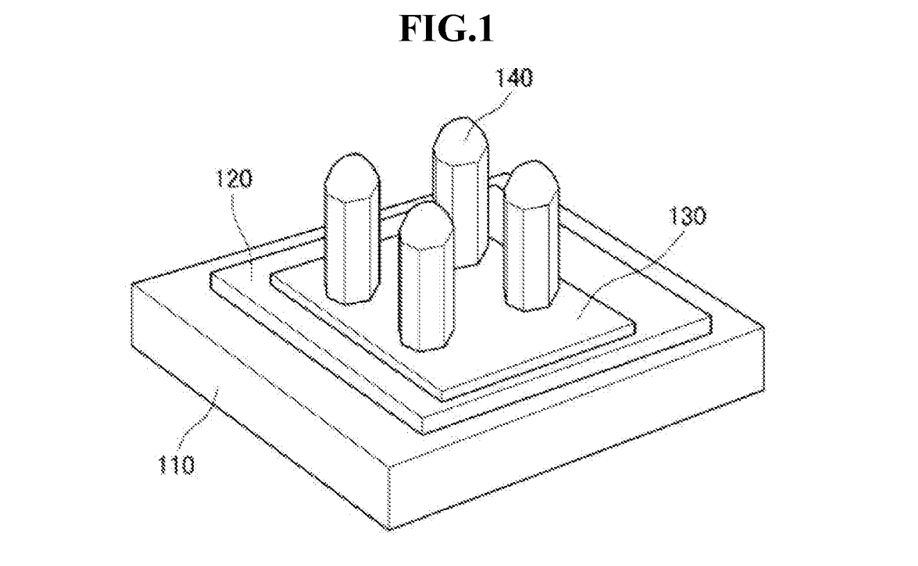
FIG. 1 is a perspective view of a structure of an optical device according to an exemplary embodiment of the present invention.
Figure 7:
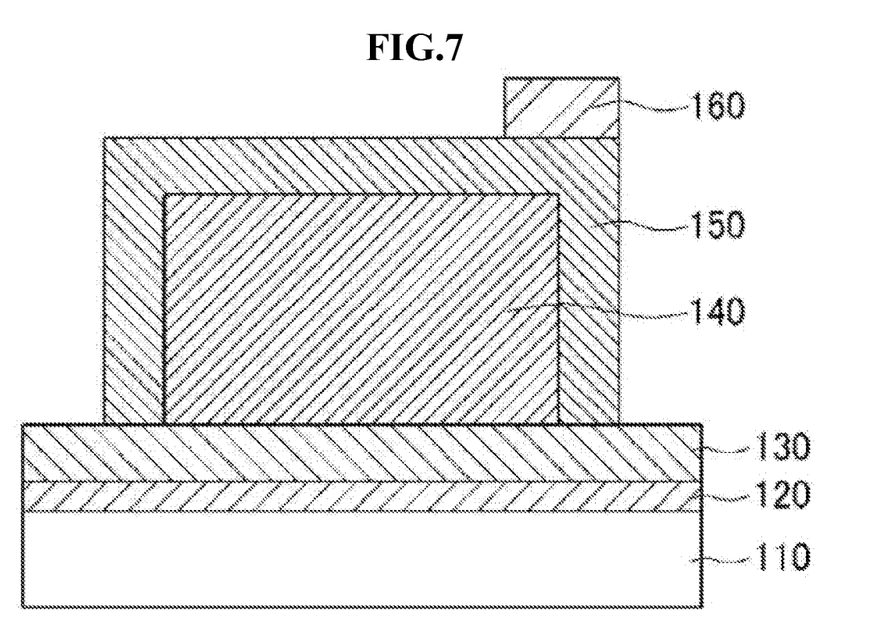
FIGS. 7 and 8 are cross-sectional views of a structure of an optical device according to another exemplary embodiment of the present invention.
Figure 8:
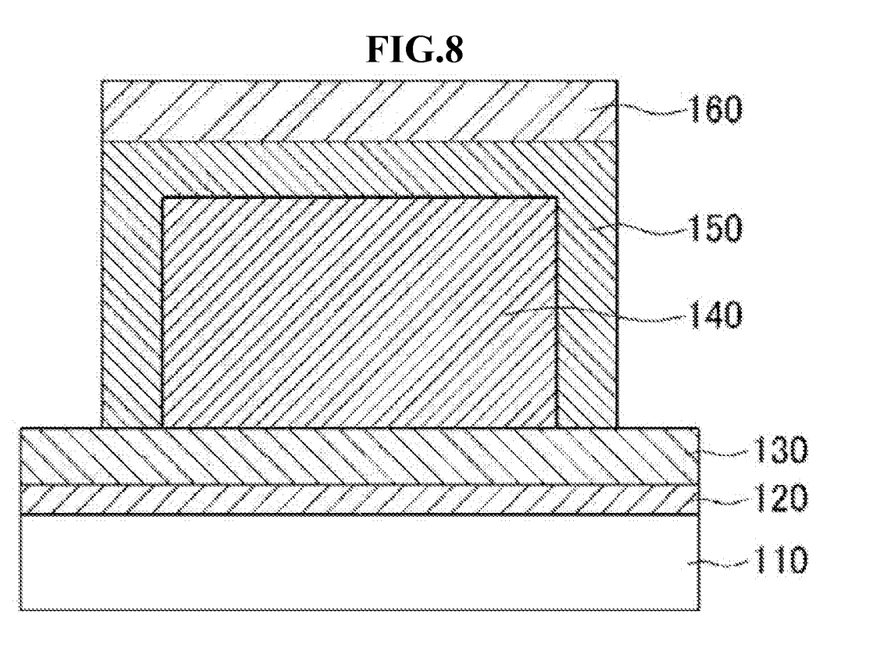

FIG. 1 is a perspective view of a structure of an optical device according to an exemplary embodiment of the present invention. FIGS. 2 through 6 are cross-sectional views of a structure of an optical device according to another exemplary embodiment of the present invention. FIGS. 7 and 8 are cross-sectional views of a structure of an optical device according to another exemplary embodiment of the present invention.

With reference to FIG. 1, the optical device according to the present invention includes a substrate 110, a current injection layer 120 formed on the substrate 110, a graphite layer 130 formed on the current injection layer 120, and a semiconductor unit 140 formed on the graphite layer 130.

The substrate 110 includes a transparent amorphous substrate and is formed of at least one material of metal, glass, and resin. The substrate 110 includes a material that does not make physical and chemical changes at high temperatures of about 1000° C. or higher, and may transmit light within the visible wavelength range.

The current injection layer 120 formed on the substrate 110 includes at least one of a metal material having conductivity, a transparent conductive oxide (TCO), and a conductive polymer.

Here, the metal material can be, for example, gold (Au), nickel (Ni), titanium (Ti), and chromium (Cr). The TCO can be, for example, indium tin oxide (ITO), indium zinc oxide (IZO), aluminum zinc oxide (AZO), and indium zinc tin oxide (IZTO).

The current injection layer 120 may be formed using at least one of a metal deposition method, a thermal evaporation method, an electronic beam (e-beam) evaporation method, and a sputtering process. In the present invention, the current injection layer 120 is formed using a metal deposition method, which is typically used to coat a metal.

The graphite layer 130 formed on the current injection layer 120 is a layered, planar or sheet-type structure formed from graphene, wherein graphene has a plurality of carbon (C) atoms covalently bonded to one another forming a single-layer polycyclic honeycomb-like aromatic molecule.

Although the covalently bonded carbon atoms in graphene form six-membered rings as a repeating unit, the covalently bonded carbon atoms may further include five-membered and/or seven-membered rings.

Accordingly, the graphite layer 130 is seen as a single layer of the covalently bonded carbon atoms (typically, sp2 bonding). The graphite layer 130 may have various structures. The structure of the graphite layer 130 may vary according to the amount of five-membered and/or seven-membered rings that may be included in the graphite layer 130.

More specifically, although the graphite layer 130 may be the above-described single graphene layer, the graphite layer 130 may include a plurality of stacked graphene layers.

The graphite layer 130 may be formed using a chemical vapor deposition (CVD) method, for example, any one method of a CVD method, a rapid thermal chemical CVD (RTCVD) method, a plasma-enhanced CVD (PECVD) method, an inductively coupled plasma (ICP) CVD method, a metal organic CVD (MOCVD) method, a low-pressure CVD (LPCVD) method, and an atmospheric pressure CVD (APCVD) method.

The current injection layer 120 and the graphite layer 130 are capable of transmitting visible light.

Accordingly, by controlling the graphite layer 130 and the current injection layer 120, light transmittance and reflectance may be regulated when light is incident to the graphite layer 130, the current injection layer 120, and the substrate 110.

A plurality of semiconductor units 140 are formed at arbitrary points on the graphite layer 130.

The semiconductor units 140 may be formed vertically or horizontally on the graphite layer 130. In the present invention, the semiconductor units 140 are formed vertically on the graphite layer 130. However, the semiconductor units 140 may not necessarily form an angle of about 90° with respect to the graphite layer 130. The semiconductor units 140 may be formed using a bottom-up method, with respect to a top surface of the graphite layer 130, from a starting point corresponding to a contact point between the semiconductor unit 140 and the graphite layer 130.

Since the surface of the graphite layer 130 is very chemically stable and hardly reactive, to grow the semiconductor units 140 on the top surface of the graphite layer 130, a damage point is formed on the surface of the graphite layer 130, and the semiconductor unit 140 is formed therefrom.

The damage point aids in causing the nucleation and growth of the semiconductor units 140 on the graphite layer 130.

Accordingly, the semiconductor units 140 may control a position of the damage point formed on the graphite layer 130 to regulate a position of the semiconductor unit 140.

To form the damage point, after a mask layer 200, having an opening 210, is provided on the graphite layer 130, the damage point is formed on the graphite layer 130 through the opening 210.

The mask layer 200 may be removed after forming the damage point on the graphite layer 130. Alternatively, the mask layer 200 may not be removed, but used instead of an insulating layer.

In addition, the semiconductor units 140 are formed of one selected from the group consisting of a fine rod, a fine needle, a fine tube, a fine wall, a thin layer, and a combination thereof. A cross-section of the semiconductor unit 140 may have various geometrical shapes, for example, a polygonal shape, a circular shape, a triangular shape, or a tetragonal shape, a composite figure shape, and straight or curved trench shapes.

The semiconductor units 140 can include at least one of an oxide, nitride carbide, a Group III-V or II-VI element, or a silicon-based material.

More specifically, the semiconductor units 140 include a material containing at least one element selected from the group consisting of silicon (Si), zinc oxide (ZnO), zinc magnesium oxide (ZnMgO), zinc cadmium oxide (ZnCdO), zinc magnesium cadmium oxide (ZnMgCdO), zinc beryllium oxide (ZnBeO), zinc magnesium beryllium oxide (ZnMgBeO), zinc manganese oxide (ZnMnO), zinc magnesium manganese oxide (ZnMgMnO), gallium nitride (GaN), aluminum nitride (AlN), gallium aluminum nitride (GaAlN), and indium gallium nitride (InGaN).

In addition, the semiconductor units 140 may be an n-type semiconductor or a p-type semiconductor depending on a dopant.

An optical device according to another exemplary embodiment of the present invention may further include an optical device layer 150 formed on the semiconductor units 140.

Figure 2:
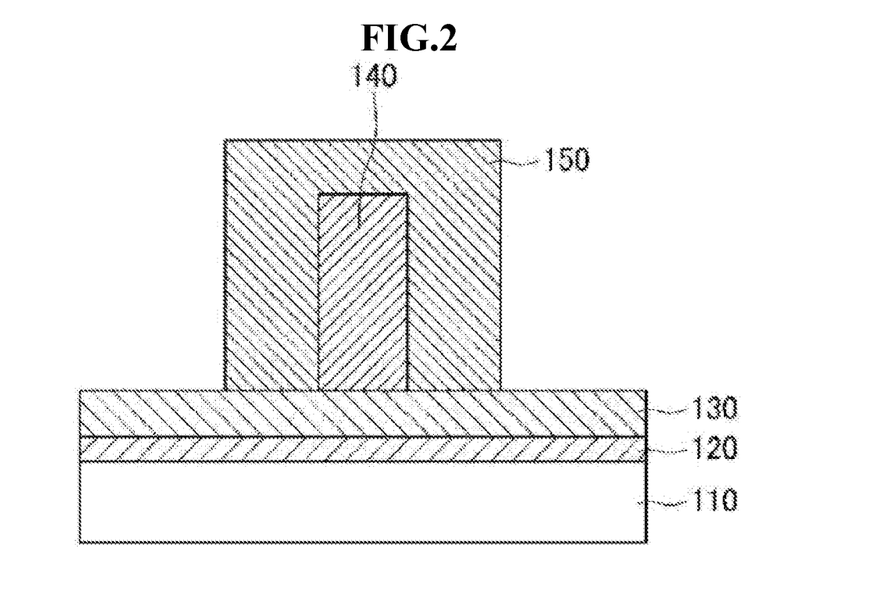
FIGS. 2 through 6 are cross-sectional views of a structure of an optical device according to another exemplary embodiment of the present invention.
Figure 3:
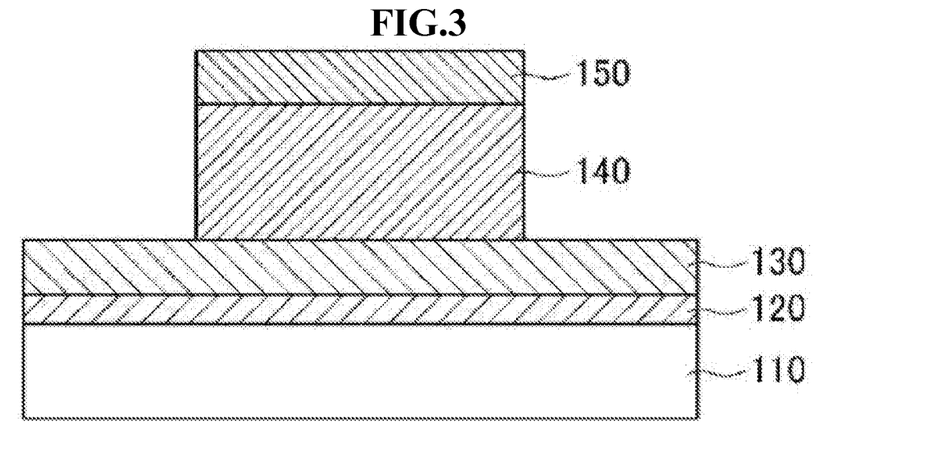

The optical device layer 150 may include a single layer or a plurality of layers. FIGS. 2 and 3 illustrate an example in which the optical device layer 150 includes a single layer, and the single optical device layer 150 is formed as an n-type semiconductor or a p-type semiconductor.

The n-type semiconductor is a semiconductor doped with donor impurities, which can include at least one of silicon (Si), germanium (Ge), selenium (Se), tellurium (Te), and carbon (C). The p-type semiconductor is a semiconductor doped with acceptor impurities, which include magnesium (Mg), zinc (Zn), and beryllium (Be).

Each of the n-type semiconductors and the p-type semiconductors include indium nitride, gallium nitride, aluminum nitride, gallium aluminum nitride, and indium gallium nitride.

Although FIG. 2 illustrates only some of the plurality of semiconductor units 140, with respect to FIG. 2, the optical device layer 150 may be formed to surround each of the semiconductor units 140.

As shown in FIG. 3, the optical device layer 150 may be formed as a thin film on the semiconductor units 140.

Figure 4:
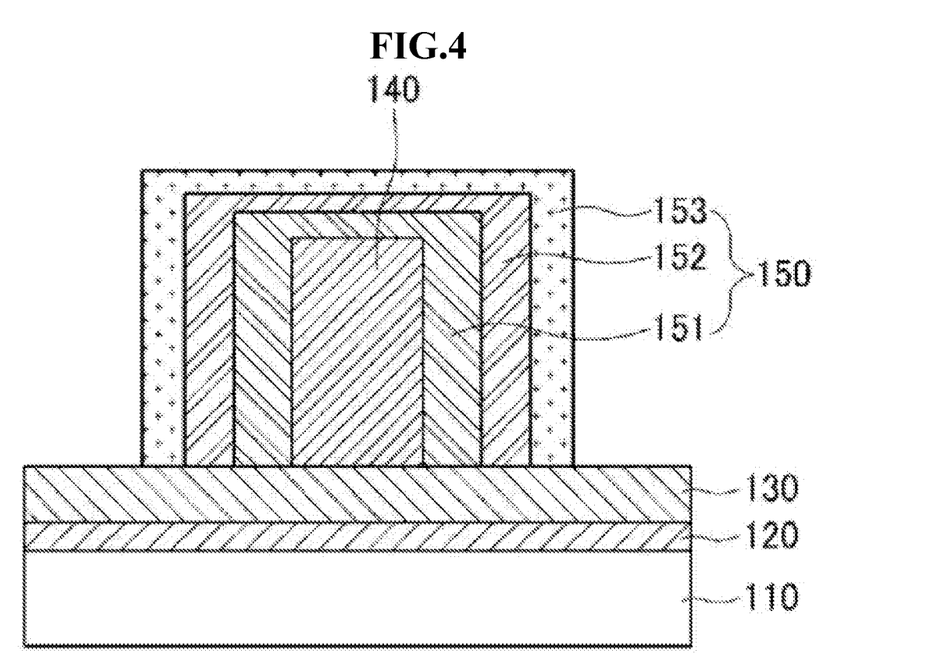
Figure 5:
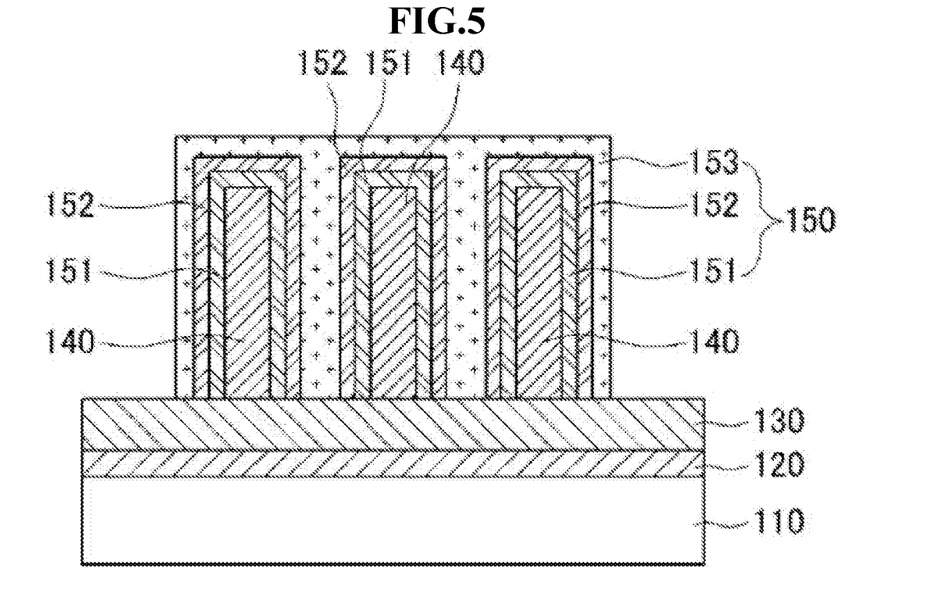
Figure 6:
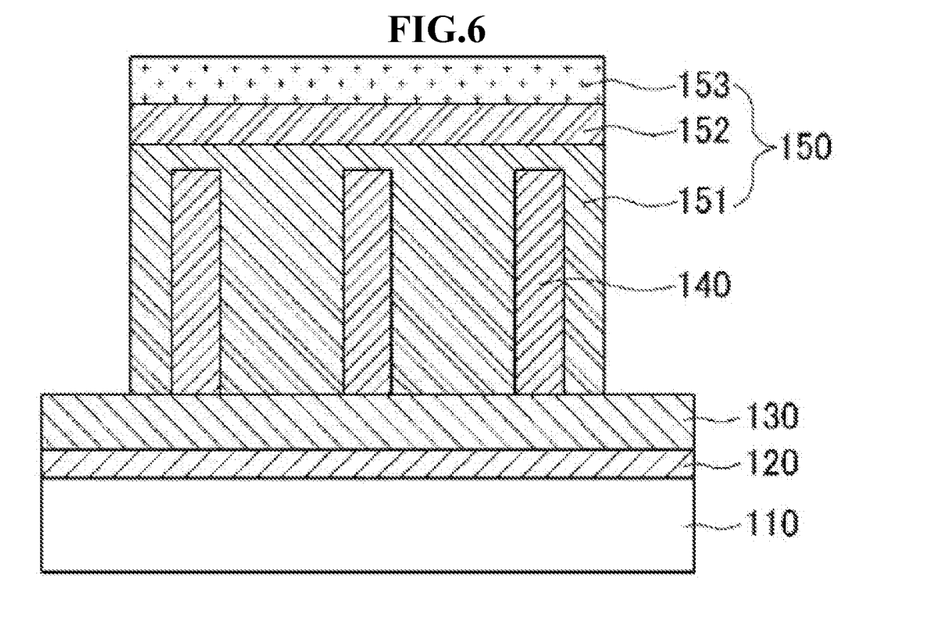

FIGS. 4 through 6 illustrate cases in which the optical device layer 150 includes a plurality of layers. With reference to FIGS. 4 through 6, the optical device layer 150 includes a first optical device layer 151, a second optical device layer 153, and a well layer 152 formed between the first optical device layer 151 and the second optical device layer 153.

However, the above-described well layer 152 may be omitted. When the well layer 152 is omitted, the first optical device layer 151 and the second optical device layer 153 may be formed in direct contact with each other.

Here, when the first optical device layer 151 is formed of an n-type semiconductor, the second optical device layer 153 is formed of a p-type semiconductor. When the first optical device layer 151 is formed of a p-type semiconductor, the second optical device layer 153 is formed of an n-type semiconductor.

A structure of the optical device layer 150, including the plurality of layers (viz., 151, 152, and 153), will now be described in further detail with reference to the appended drawings. As shown in FIG. 4, the optical device layer 150 may surround each of the semiconductor units 140 and be formed by stacking of the first optical device layer 151, the well layer 152, and the second optical device layer 153.

As shown in FIG. 5, after the first optical device layer 151 and the well layer 152 are stacked on each of the semiconductor units 140, the second optical device layer 153 may be formed as a thin film to cover the resultant structure.

In addition, as shown in FIG. 6, after the first optical device layer 151 is formed as a thin film to cover each of the semiconductor units 140, the well layer 152 and the second optical device layer 153 may be stacked as thin films on the first optical device layer 151.

An optical device according to another exemplary embodiment of the present invention may further include a second electrode layer 160 formed on the optical device layer 150.

When the second electrode layer 160 is formed, in particular, when the second electrode layer 160 is formed to correspond to a top portion of the optical device layer 150, as shown in FIG. 8, the second electrode layer 160 may be formed to such a thickness as to obtain a predetermined transmittance and reflectance with respect to light.

For example, when the optical device according to the present invention is used as an emission device, the second electrode layer 160 is formed to such a thickness to reflect light so that light generated by the optical device layer 150 is collected toward the substrate 110.

In addition, when the second electrode layer 160 is formed, the above-described current injection layer 120 is used as a first electrode layer, or an additional first electrode layer is formed.

When the current injection layer 120 is used as the first electrode layer, the optical device is structurally simple, and process costs and time are reduced.

Figure 9:
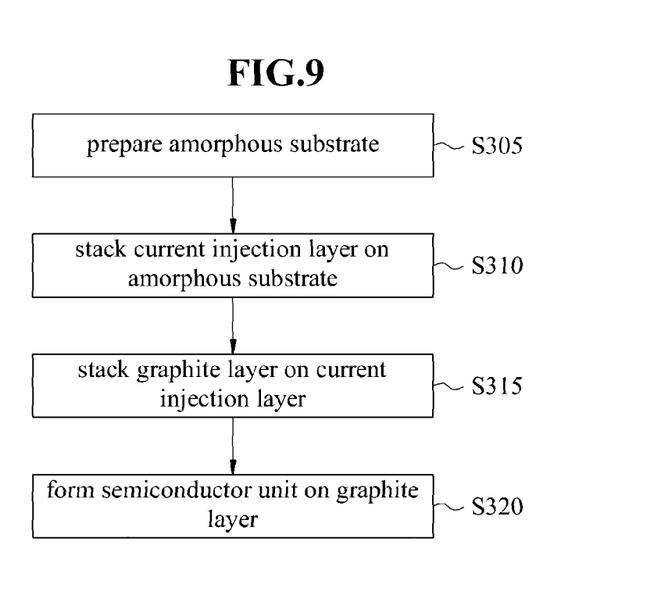
FIGS. 9 and 10 are flowcharts illustrating a method of manufacturing the optical device shown in FIG. 1.
Figure 10:
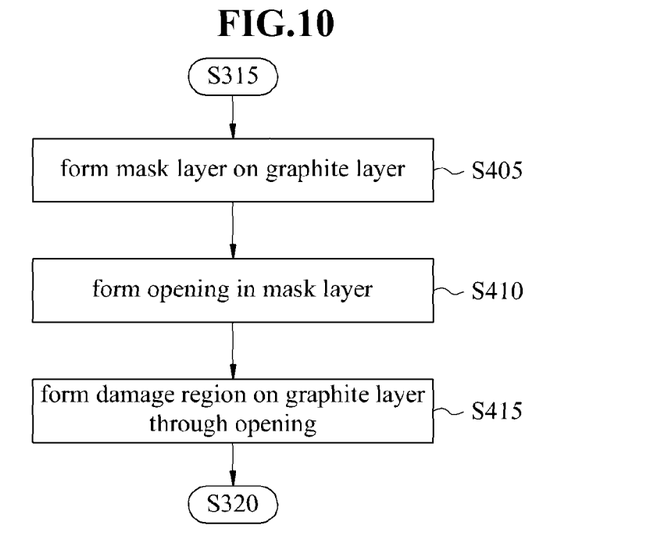
Figure 11:
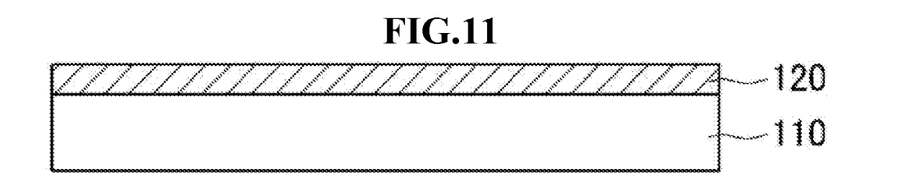
FIGS. 11 through 16 are cross-sectional views of a process of manufacturing an optical device.
Figure 12:
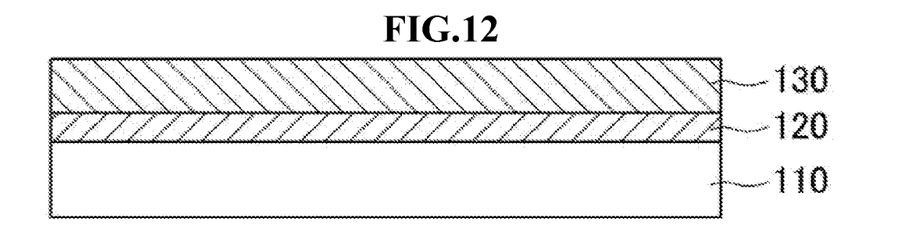
Figure 13:
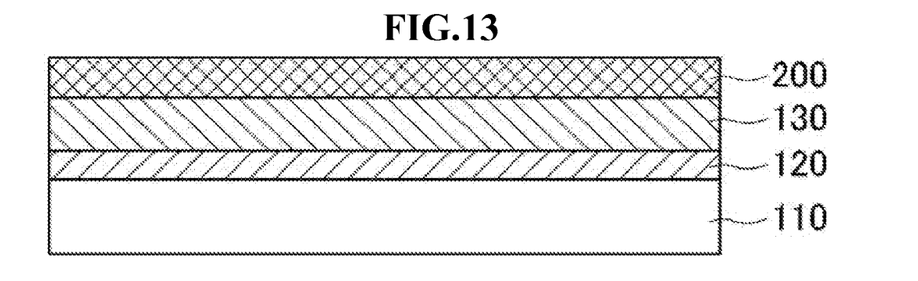
Figure 14:
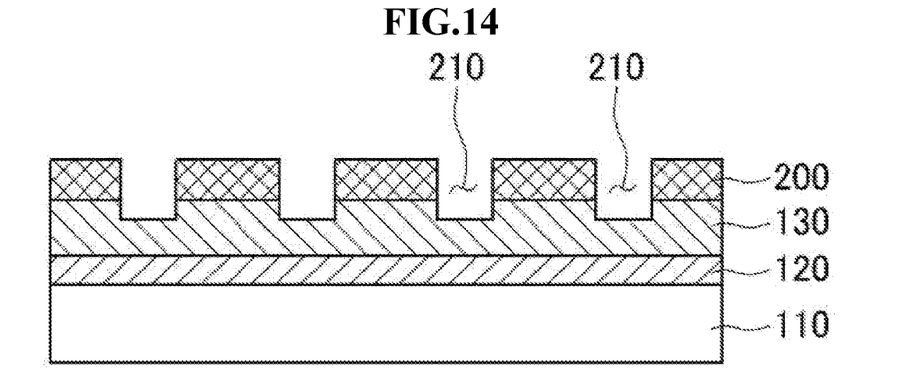
Figure 15:
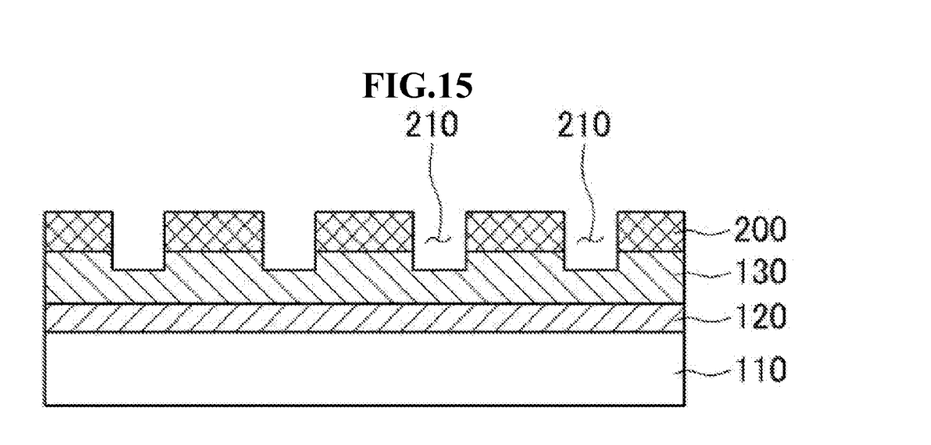
Figure 16:
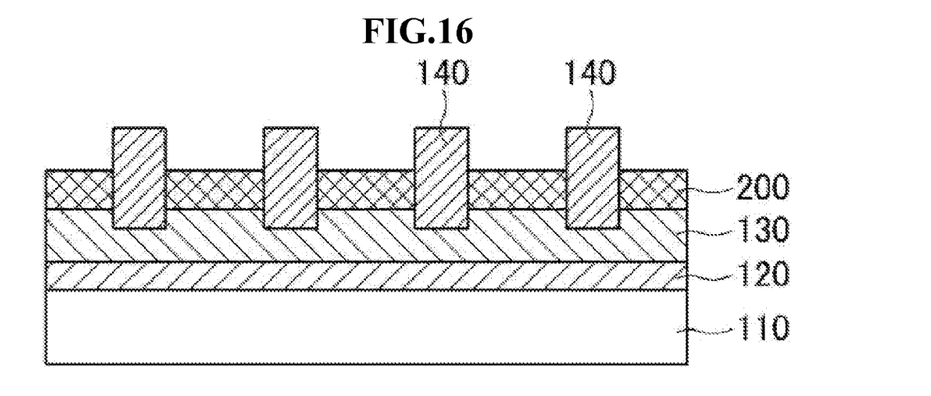

FIGS. 9 and 10 are flowcharts illustrating a method of manufacturing the optical device shown in FIG. 1, and FIGS. 11 through 16 are cross-sectional views of a process of manufacturing an optical device.

Hereinafter, a method of manufacturing an optical device according to the present invention will be described with reference to FIGS. 9 through 16.

The method of manufacturing the optical device according to the present invention includes preparing a substrate 110 (step S305), forming a current injection layer 120 on the substrate 110 (step S310), forming a graphite layer 130 on the current injection layer 120 (step S315), and forming a semiconductor unit 140 on the graphite layer 130 (step S320).

A transparent amorphous substrate is prepared as the substrate 110 (step S305). The substrate 110 includes at least one material of a metal, a glass, and a resin. A substrate that does not make physical and chemical changes at high temperatures of about 1000° C. or higher, and may transmit light within the visible and ultraviolet (UV) wavelength ranges is prepared as the substrate 110.

After the substrate 110 is prepared, the current injection layer 120 is formed on the substrate 110 (step S310).

The current injection layer 120 is formed of a metal, such as Au, Ni, Ti, or Cr, a TCO, such as ITO, IZO, AZO, or IZTO, and a conductive polymer using a metal deposition method, such as a thermal evaporation method, an e-beam evaporation method, or a sputtering process.

After the current injection layer 120 is formed, the graphite layer 130 is formed on the current injection layer 120 (step S315).

The graphite layer 130 is a layered, planar or sheet-type structure formed from graphene, wherein graphene has a plurality of carbon atoms that are covalently bonded to one another forming a single-layer polycyclic honeycomb-like aromatic molecule.

The graphite layer 130 is formed using a CVD method, such as a thermal CVD (T-CVD) method, a RTCVD method, a PECVD method, an ICP-CVD method, an MOCVD method, an LPCVD method, or an APCVD method.

The semiconductor unit 140 is formed on a top surface of the graphite layer 130 (step S320).

After forming a damage point on the graphite layer 130, the semiconductor unit 140 is formed on the damage portion using a bottom-up method.

A method of forming the damage points on the graphite layer 130, before forming the semiconductor units 140, will now be described (cf. FIG. 10). The method for forming the damage points includes providing a mask layer 200 on a top surface of a graphite layer 130 (step S405), forming an opening 210 in the mask layer 200 (step S410), and forming a damage point through the opening 210 (step S415).

The positions of the damage point formed on the graphite layer 130 are controlled using the position of the mask layer 200, provided on the graphite layer 130, and the opening 210 formed on the mask layer 200, so that the positions of the semiconductor units 140 can be controlled.

In addition, the opening 210 formed on the mask layer 200 is formed using at least one method of an e-beam lithography process, a photolithography process, a nano-imprint process, an aluminum anodic oxidation (AAO) process, a laser interference lithography process, a template process, and a block copolymer process.

After the opening 210 is formed on the mask layer 200, the damage point is formed on the graphite layer 130 through the opening 210. The damage point is formed using at least one method of gas plasma, ionic beams, e-beams, proton beams, and neutron beams.

The damage points formed on the graphite layer 130 functions as seeding points and aids in the formation of the semiconductor units 140.

After the damage points are formed on the graphite layer 130 in the above-described manner, the above-described semiconductor units 140 are formed.

The semiconductor units 140 are formed using at least one method of a CVD process, a sputtering process, a thermal or e-beam evaporation process, a pulse laser deposition (PLD) process, and a vapor-phase transport process.

In the present invention, the semiconductor units 140 are formed using an MOCVD process. In particular, when the semiconductor units 140 are formed using a catalyst-free MOCVD process, contamination caused by the catalyst is prevented due to the lack of catalyst, and semiconductor units 140 having excellent electrical and optical performance can be obtained.

A method of manufacturing the optical device shown in FIGS. 2 through 6, according to another exemplary embodiment of the present invention, further includes forming an optical device layer 150 on the semiconductor units 140 after forming the semiconductor units 140.

When a single optical device layer 150 is further formed on the semiconductor units 140 as shown in FIGS. 2 and 3, the single optical device layer 150 is formed of an n-type semiconductor or a p-type semiconductor. One of silicon, germanium, selenium, tellurium, and carbon is used as n-type donor impurities, and one of magnesium, zinc, and beryllium is used as p-type acceptor impurities. A semiconductor material is formed using one of indium nitride, gallium nitride, aluminum nitride, gallium aluminum nitride, and indium gallium nitride.

When an optical device layer 150, including a plurality of layers (viz., 151, 152, 153), is further formed on the semiconductor units 140 as shown in FIGS. 4 through 6, the optical device layer 150 includes a first optical device layer 151, a well layer 152, and a second optical device layer 153. When the first optical device layer 151 is formed of an n-type semiconductor, the second optical device layer 153 is formed of a p-type semiconductor. When the first optical device layer 151 is formed of a p-type semiconductor, the second optical device layer 153 is formed of an n-type semiconductor.

In addition, a method of manufacturing the optical device shown in FIGS. 7 and 8, according to another exemplary embodiment of the present invention, further includes forming a second electrode layer 160 on the optical device layer 150.

The second electrode layer 160 is formed of the same material as the above-described current injection layer 120 using the same method for forming the current injection layer 120, and thus a description thereof is omitted.

Furthermore, when the second electrode layer 150 is formed, the previously formed current injection layer 120 may be used as a first electrode layer, or an additional first electrode layer may be formed on the graphite layer 130.

When an additional first electrode layer is formed, an insulating layer may be formed between the first electrode layer and the second electrode layer 150.

In particular, when the current injection layer 120 is used as the first electrode layer, the optical device is structurally simple and process costs and time are reduced, as compared with the case in which the additional first electrode layer is formed.

In an optical device according to the present invention, since a current injection layer is formed on an amorphous substrate, the limits of a conventional amorphous substrate to which current is not supplied can be overcome.

In addition, a graphite layer is formed on the current injection layer so that physical or chemical deformations of the current injection layer can be prevented.

Furthermore, the salient features of a transparent amorphous substrate can be maximized by controlling the thicknesses of the current injection layer and the graphite layer, and the direction of light emitted by or absorbed in the optical device can be controlled.

In particular, since a semiconductor unit is formed on the graphite layer, the problems caused by the formation of the semiconductor unit on a conventional amorphous substrate can be reduced, and a semiconductor unit having a high crystallinity can be formed.

While this invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in an exemplary sense only and not for purposes of limitation. For example, each component referred to as a single type may be divided, and components referred to as being divided may be combined as a single type.

Therefore, the scope of the invention is defined not by the detailed description of the invention, but by the appended claims, and all differences within the scope will be construed as being included in the present invention.

The invention claimed is:

1. An optical device comprising:
   a substrate;
   a graphite layer formed on the substrate;
   a semiconductor unit formed on the graphite layer; and
   an optical device layer comprising a first optical device layer and a second optical device layer formed on a surface of the semiconductor unit, a n-type semiconductor and an n-type semiconductor being alternatively formed with respect to the first layer and the second layer, wherein
   the optical device layer is formed to surround the semiconductor unit by stacking of the first optical device layer and the second optical device layer, and wherein
   if the semiconductor unit comprises a plurality of semiconductor units,
   the first optical device layer is formed either to surround each of the semiconductor units and the second optical device layer is formed as a thin film to cover the first optical device layer or
   the first optical device layer is formed as a thin film to cover each of the semiconductor units and the second optical device layer is formed as a thin film by stacking on the first optical device layer.

2. The optical device of claim 1, wherein the substrate is formed of a material, which is deformed due to physical and chemical actions at a high temperatures of about 1000° C. or higher, and transmits visible light.

3. The optical device of claim 1, wherein the semiconductor unit includes a structure selected from the group consisting of a fine rod, a fine needle, a fine tube, a fine wall, and a thin layer.

4. The optical device of claim 1, wherein the semiconductor unit is grown from a damage point disposed on the graphite layer.

5. The optical device of claim 4, wherein a mask layer in which at least one or more openings are patterned is formed on the graphite layer, and the damage point is formed through the openings, and wherein a positions of the semiconductor units are controlled by the damage point through the openings.

6. The optical device of claim 1, further comprising:
a well layer formed between the first optical device layer and the second optical device layer, the first optical device layer is formed of one of an n-type semiconductor and a p-type semiconductor, and the second optical layer is formed of the other of the n-type semiconductor and the p-type semiconductor.

7. The optical device of claim 6, wherein the n-type semiconductor includes gallium nitride (GaN), aluminum nitride (AlN), gallium aluminum nitride (GaAlN), or indium gallium nitride (InGaN), which is doped with impurities of at least one selected from the group consisting of silicon (Si), germanium (Ge), selenium (Se), tellurium (Te), and carbon (C), and the p-type semiconductor includes GaN, AlN, GaAlN, or InGaN, which is doped with impurities of at least one selected from the group consisting of magnesium (Mg), zinc (Zn), and beryllium (Be).

8. The optical device of claim 1, further comprising:
a current injection layer formed between the substrate and the graphite layer, wherein the current injection layer is formed of a conductive material.

9. The optical device of claim 8, wherein the current injection layer and the graphite layer are formed to such a thickness as to obtain a predetermined transmittance and a predetermined reflectance with respect to visible light or ultraviolet (UV) light.

10. The optical device of claim 8, further comprising:
an electrode layer formed on the optical device layer.

11. The optical device of claim 10, wherein the current injection material is formed on the substrate.

12. A method of manufacturing an optical device, comprising:
preparing a substrate;
forming a graphite layer on the substrate;
forming a semiconductor unit on the graphite layer; and
forming an optical device layer comprising a first optical device layer and a second optical device layer on a surface of the semiconductor unit, wherein a n-type semiconductor and an n-type semiconductor is alternatively formed with respect to the first layer and the second layer, wherein
forming the optical device layer to surround the semiconductor unit by stacking of the first optical device layer and the second optical device layer, and wherein
if the semiconductor unit comprises a plurality of semiconductor units,
forming either the first optical device layer to surround each of the semiconductor units and forming the second optical device layer as a thin film to cover the first optical device layer or
forming the first optical device layer as a thin film to cover each of the semiconductor units and forming the second optical device layer as a thin film by stacking on the first optical device layer.

13. The method of claim 12, wherein in the forming of the graphite palter, the graphite layer is formed using a chemical vapor deposition (CVD) process.

14. The method of claim 12, further comprising forming a damage point configured to grow the semiconductor unit, on the graphite layer.

15. The method of claim 14, wherein the damage point is formed using at least one selected from the group consisting of gas plasma, ionic beams, e-beams, proton beams, and neutron beams.

16. The method of claim 14, wherein the forming of the damage point comprises:
forming a mask layer on the graphite later;
patterning the mask layer to form at least one opening; and
forming the damage point through the opening the graphite layer.

17. The method of claim 16, wherein the step of forming the opening is performed using at least one of an e-beam lithography process, a photolithography process, a nanoimprint process, an aluminum anodic oxidation (AAO) process, a laser interference lithography process, a template process, and a block copolymer process.

18. The method of claim 12, further comprising:
forming a current injection layer formed of a conductive material on the substrate.

19. The method of claim 18, further comprising:
forming an optical device layer on the semiconductor unit.

20. The method of claim 19, wherein the current injection layer is a first electrode layer, the method further comprising forming a second electrode layer on a surface of the optical device layer.

21. The method of claim 20, further comprising forming an insulating layer between the current injection layer and the second electrode layer before or after the step of forming the optical device layer.

22. The method of claim 20, wherein the second electrode layer is formed to such a thickness as to transmit or reflect light.

* * * * *